United States Patent
Huang et al.

(10) Patent No.: US 6,444,410 B1
(45) Date of Patent: Sep. 3, 2002

(54) METHOD OF IMPROVING PHOTORESIST PROFILE

(75) Inventors: I-Hsiung Huang, Kaohsiung; Anseime Chen, Hsinchu; Chieh-Ming Wang, Hsinchu Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/688,606

(22) Filed: Oct. 14, 2000

(30) Foreign Application Priority Data

Sep. 29, 2000 (TW) .......................................... 89120195 A

(51) Int. Cl.$^7$ ................................................ G03F 7/26
(52) U.S. Cl. ........................................ 430/330; 430/322
(58) Field of Search ................................. 430/311, 322, 430/327, 330

(56) References Cited

U.S. PATENT DOCUMENTS 6,271,900 B1 * 8/2001 Li ................................ 349/95

* cited by examiner

*Primary Examiner*—Kathleen Duda
(74) *Attorney, Agent, or Firm*—J.C. Patents

(57) ABSTRACT

A method of improving a photoresist profile. After a photoresist layer is developed, a hard bake is performed at a temperature lower than a glass transition temperature of the photoresist layer. The photoresist layer is thus able to reflow, so that the profile can be modified. Or alternatively, the hard bake step can be replace by first performing a hard bake at a temperature higher than the glass transition temperature, followed by performing a flow bake at a temperature lower than the glass transition temperature.

13 Claims, 3 Drawing Sheets

METHOD OF IMPROVING PHOTORESIST PROFILE

CROSS-REFERENCE TO RELATED APPLICATION

This application claims the priority benefit of Taiwan application serial no. 89120195, filed Sep. 29, 2000.

BACKGROUND OF THE INVENTION

Field of the Invention

The invention relates in general to a method of improving photoresist profile. More particularly, this invention relates to a method of using a high temperature flow bake to make the photoresist layer reflow, so as to improve the profile thereof. Description of the Related Art In the conventional method for patterning or defining a contact window or a via hole, a photoresist layer is formed on a surface of the layer in which the contact window or the via hole is to be formed. An opening is formed by patterning the photoresist layer to expose the portion at which the contact window or the via hole is formed subsequently. The conventional method to patterning photoresist layer, as shown in FIG. 1, comprises the steps of photoresist coating (Step 101), soft bake (Step 102), exposure (Step 103), post-exposure bake (Step 104), development (Step 105) and the hard bake (Step 106).

After the steps of exposure 103, the post-exposure bake 104, and the development step 105, a hard bake step 106 is performed to evaporate the remaining solvent contained in the photoresist layer. In addition to minimize the containing solvent, the adhesion of the photoresist layer can also be improved. Furthermore, the hard bake step is also advantageous to resist of the subsequent etching and ion implantation processes. The selectivity of such processes can be increased to etch or implant selectively only the positions uncovered by the photoresist layer.

A hot plate is typically used for performing the hard bake step. In the conventional method, as shown in FIG. 1, the temperature for the hard bake 106 is about 110° C. for about 90 seconds. The purpose is to solidify the photoresist and to form the profile of the photoresist layer. Therefore, an operation temperature of the bake hard step is normally less than the glass transition temperature ($T_g$) of the photoresist layer.

After performing the hard bake step, an after develop inspection (ADI) is performed to ensure whether the photoresist layer meets the specification. A top down inspection by scanning electron microscope (SEM) is commonly used for the after develop inspection.

FIG. 2 shows a cross sectional view of the SEM top down inspection result for a photoresist layer being exposed when defocus occurs. A photoreist profile being performed with the steps of exposure, post exposure bake and the hard bake is shown. As shown in FIG. 2, at a top corner of the opening in the photoresist layer, a top reentrant is formed. A narrower opening observed by the SEM top down inspection thus very likely to fail the specification, so that a rework is required. However, if observing from the cross sectional view as shown in FIG. 2, only the top portion of the opening is narrowed, while the lower portion of the opening can meet the specification.

SUMMARY OF THE INVENTION

The invention provides a method of improving the photoresist profile. A photoresist layer is formed, followed by performing the steps of soft bake, exposure, post exposure bake, development and hard bake with an operation temperature higher than the glass transition temperature of the photoreist layer.

The invention further provides another method of improving the photoresist profile. A photoresist layer is formed, followed by performing the steps of soft bake, exposure, post exposure bake, development, hard bake and flow bake. The hard bake is performed at a temperature lower than the glass transition temperature of the photoreist layer, while the flow bake is performed at a temperature higher than the glass transition temperature of the photoresist layer.

By the method provided in the invention, the reentrant formed in the conventional method can be eliminated by re-flow of the photoresist layer. The processing window is widened and the mask error factor is also reduced. As a result, the uniformity of critical dimension (CD) can thus be effectively enhanced.

Both the foregoing general description and the following detailed description are exemplary and explanatory only and are not restrictive of the invention, as claimed.

DESCRIPTION OF THE PREFERRED EMBODIMENTS

For a contact window or a via hole with a width of 0.18 microns or even less, it is very difficult to increase the process window with a depth of focus (DOF) of more than 0.6 micron for mass production. Traditionally, a conventional photoresist process is used to pattern such a contact window. But the conventional process can hardly meet the requirements of the next generation. For a super-small contact hole, thermal flow can improve photoresist profile by achieving a larger DOF through thermal flow control. The improved photoresist profile delivers a larger DOF and a lower mask error factor (MEF). The invention provides a method to improve the photoresist profile using the thermal flow control.

Figure 1:
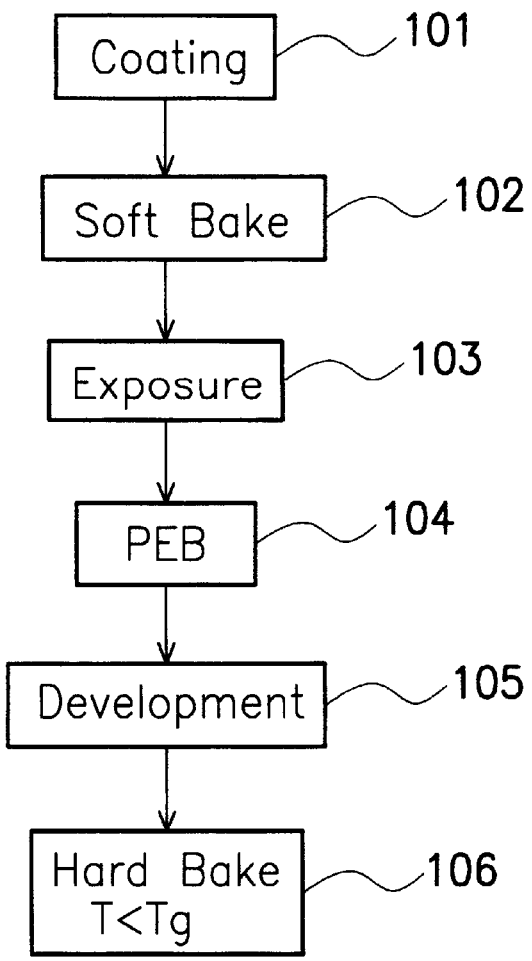
FIG. 1 is a process flow for a conventional method of patterning a photoreist layer.
Figure 2:
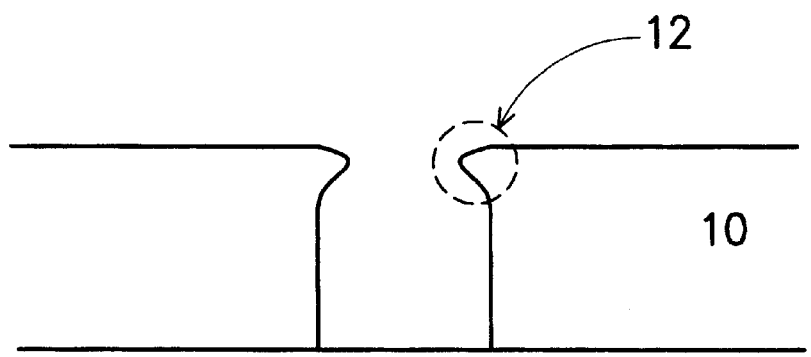
FIG. 2 is a cross sectional view of a photoresist layer patterned by a conventional method.
Figure 3:
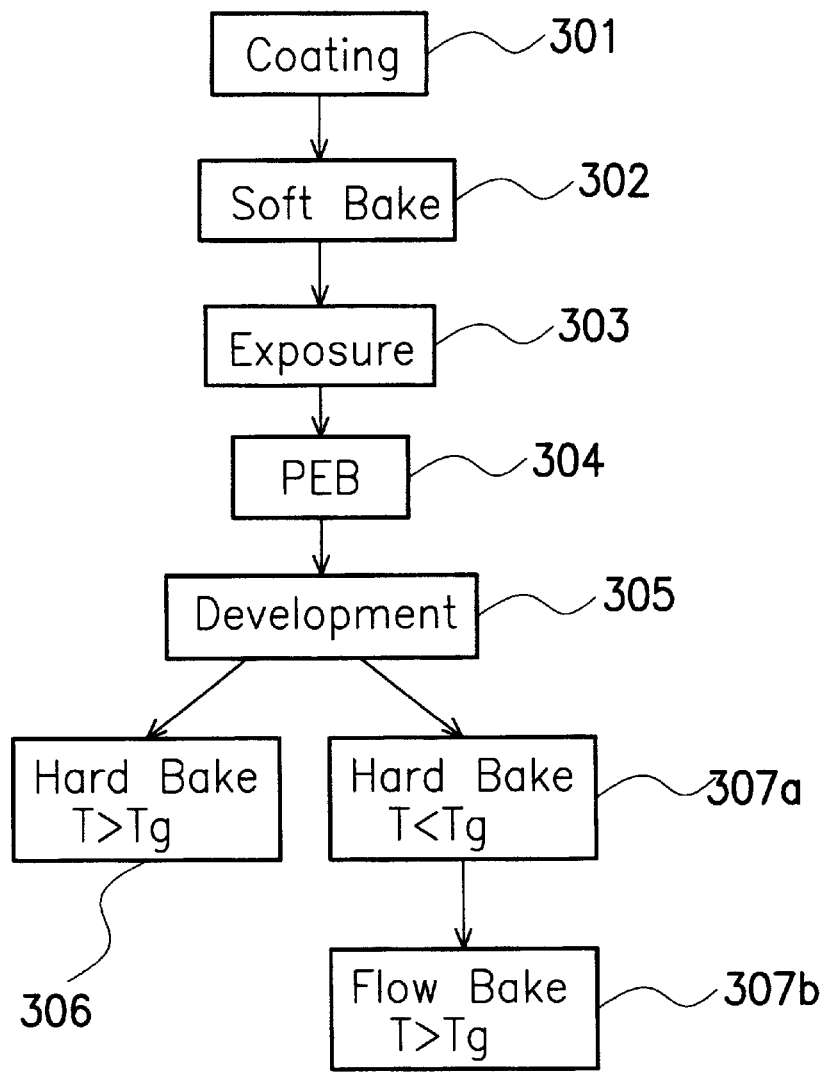
FIG. 3 shows a process flow of a method for patterning a photoreist layer according to the invention.

In FIG. 2, an embodiment of a method for improving a photoresist profile is illustrated. In FIG. 3, a cross sectional view of a photoresist patterned by the method as shown in FIG. 2 is illustrated. As shown in FIG. 2 and FIG. 3, in step 301, a photoresist layer 20 is formed on a surface 100 in which a contact hole is to be formed. The method for forming the photoresist layer 20 includes, for example, a spin coating step. At the mean time, the photoresist layer 20 is normally in a liquid state. To volatilize the solvent contained in the photoresist layer 20, a soft bake step is performed at a temperature of about 90–100° C. for about 60–90 seconds in step 302. The photoresist layer 20 is thus converted from a liquid state to a solid thin film on the surface.

Figure 4:
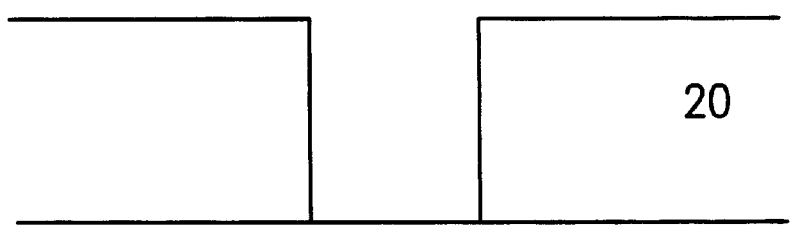
FIG. 4 is a cross sectional view of a photoresist layer patterned by a method as shown in FIG. 3.

After the soft bake step, an exposure step 303 is performed on the photoresist layer 20, followed by performing the steps of post-exposure bake (PEB) 304 and development 305. The temperature for performing the post-exposure bake 304 is about 100–120° C., and the duration for such process is about 60–90 seconds. As shown in FIG. 2, after development, a step of hard bake is performed, and the temperature of the hard bake depends on which kind of flow step is performed. When a single flow step 306 is used, only the hard bake step 306 is performed to make the photoresist layer reflow, so that any reentrant structures formed can be removed thus, the profile of an opening with a substantially vertical sidewall in the photoresist layer 20, as shown in FIG. 4, can be achieved. The reentrant formed in the conventional method can thus be eliminated. The temperature of such hard bake step is higher than the glass transition temperature of the photoresist layer 20. For a typical polymer photoresist material, the glass transition temperature ($T_g$) is about 130–140° C., while the temperature for performing hard bake step for the single flow step is about 135–145° C. The duration for such hard bake step is about 60–90 seconds.

When a multiple flow step is used, a flow bake 307b step is performed after performing the hard bake 307a. For a typical polymer photoresist material, the hard bake 307a is performed at about 110° C., which is lower than the glass transition temperature, for about 90 seconds. After the hard bake process 307a, the flow bake step 307b is performed at a temperature higher than the glass transition temperature. Again, for a typical photoreist material, the temperature is about 135–145° C. and the duration of the flow bake process is for about 60–90 seconds. The photoresist layer 20 can thus reflow to modify the profile, and the reentrant formed in the conventional method is thus eliminated.

For the single flow step, a higher throughput is resulted due to the simpler process steps. In contrast, for the multiple flow step, though the throughput is not as high, the control of critical dimension (CD) is better. Therefore, the invention uses the thermal flow characteristic of polymer photoresist material to effectively control the profile and reduce the energy latitude without using optical proximity correction (OPC). The mask error factor can thus be decreased, and the critical dimension uniformity can also be enhanced.

Figure 5:
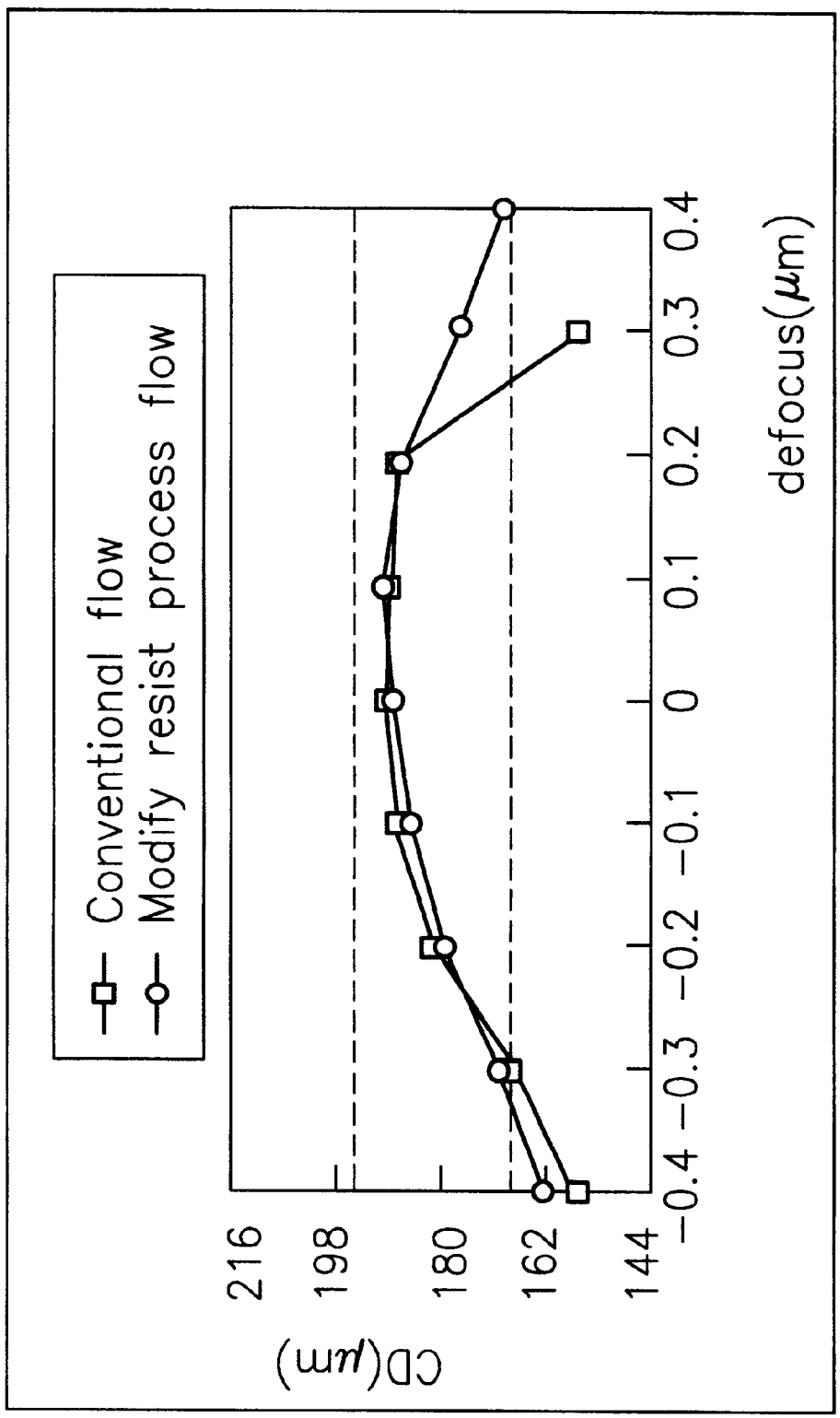
FIG. 5 shows an energy versus defocus curve (ED-tree) for both the conventional method as shown in FIG. 1 and the method as shown in FIG. 4.

FIG. 5 shows an energy versus defocus curve (ED-Tree). By the flow step, one can easily control photoresist profile and flat the ED-tree to enlarge the photoresist process window.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of improving a photoresist profile for a semiconductor manufacturing, the method comprising:

forming a photoresist layer;

performing a soft bake on the photoresist layer;

performing an exposure step on the photoresist layer;

performing a post-exposure bake step on the photoresist layer;

performing a development step on the photoresist layer so as to form an opening in the photoresist layer; and performing a hard bake step at a temperature higher than a glass transition temperature of the photoresist layer on the photoresist layer so that any reentrant structures formed in the opening in the photoresist layer is effectively eliminated rendering a sidewall of said opening substantially vertical.

2. The method according to claim 1, wherein the step of forming a photoresist layer comprises a step of forming a polymer photoresist layer.

3. The method according to claim 1, wherein the step of performing a soft bake comprises performing the soft bake at about 90–110° C. for about 60–90 seconds.

4. The method according to claim 1, wherein the step of performing a post exposure bake step comprises a step of performing the post exposure bake about about 100–120° C. for about 60–90 seconds.

5. The method according to claim 1, wherein the step of performing a hard bake step comprises a step of performing the hard bake at a temperature of about 135–145° C.

6. The method according to claim 1, wherein the step of performing a hard bake step comprises a step of performing the hard bake for about 60–90 seconds.

7. The method according to claim 1, wherein the step of performing a hard bake step comprises a step of performing the hard bake at a temperature of about 110° C. for about 90 seconds.

8. A method of improving a photoresist profile for a semiconductor manufacturing, the method comprising:

forming a photoresist layer with a pattern having at least one opening;

performing a hard bake step at a temperature lower than a glass transition temperature of the photoresist layer on the photoresist layer; and performing a flow bake step at a temperature higher than the glass transition temperature of the photoresist layer on the photoresist layer so that any reentrant structures formed in the opening is effectively eliminated rendering a sidewall of the opening substantially vertical.

9. The method according to claim 8, wherein the step of forming a photoresist layer comprises a step of forming a polymer photoresist layer.

10. The method according to claim 8, further comprising a step of performing the soft bake at about 90–110° C. for about 60–90 seconds.

11. The method according to claim 8, further comprising a step of performing a post exposure bake step at about 100–120° C. for about 60–90 seconds.

12. The method according to claim 8, wherein the step of performing a flow bake step comprises a step of performing the hard bake at about 135–145° C.

13. The method according to claim 8, wherein the step of performing a flow bake step comprises a step of performing the hard bake for about 60–90 seconds.

* * * * *